United States Patent
Tsang

(10) Patent No.: US 8,253,147 B2
(45) Date of Patent: Aug. 28, 2012

(54) LIGHT EMITTING CHIP AND METHOD FOR MANUFACTURING THE SAME

(75) Inventor: Jian-Shihn Tsang, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/029,128

(22) Filed: Feb. 17, 2011

(65) Prior Publication Data

US 2012/0187443 A1 Jul. 26, 2012

(30) Foreign Application Priority Data

Jan. 20, 2011 (TW) ................................ 100102022

(51) Int. Cl.
*H01L 33/00* (2010.01)
*H01L 33/12* (2010.01)

(52) U.S. Cl. ................ 257/79; 257/E33.003; 438/46

(58) Field of Classification Search .................... 257/79, 257/94, E33.001, E33.003; 438/22, 46
See application file for complete search history.

(56) References Cited

U.S. PATENT DOCUMENTS

| | | | |
|---|---|---|---|
| 2010/0093123 A1* | 4/2010 | Cho et al. ................ | 438/42 |
| 2010/0117057 A1* | 5/2010 | Noh et al. ................ | 257/13 |
| 2011/0101307 A1* | 5/2011 | Lee et al. ................ | 257/22 |
| 2011/0121330 A1* | 5/2011 | Tak et al. ................ | 257/94 |
| 2011/0127544 A1* | 6/2011 | Paskova et al. ........ | 257/77 |

* cited by examiner

*Primary Examiner* — Hsien Ming Lee
*Assistant Examiner* — Michele Fan
(74) *Attorney, Agent, or Firm* — Altis Law Group, Inc.

(57) ABSTRACT

A light emitting chip includes a substrate, a buffer layer formed on the substrate and including a number of horizontally grown nitride nanostructures, a cap layer grows from a top of the nitride nanostructures, and a light emitting structure formed on the cap layer. The light emitting structure sequentially comprises a first semiconductor layer connected to the cap layer, a light emitting layer, and a second semiconductor layer.

18 Claims, 2 Drawing Sheets

LIGHT EMITTING CHIP AND METHOD FOR MANUFACTURING THE SAME

BACKGROUND

1. Technical Field

The present disclosure relates to light emitting chips and a method for manufacturing the light emitting chip, and more particularly, to a light emitting chip having nitride nanostructure for decreasing lattice defects thereof.

2. Description of Related Art

Generally, a light emitting diode (LED) chip includes a buffer layer between a substrate and a semiconductor layer. The buffer layer usually grows on the substrate in low temperature to decrease the lattice mismatches between the substrate and the semiconductor layer. However, the buffer layer grown in low temperature can only decrease the vertical lattice mismatches without the horizontal lattice mismatches, whereby the lattice defects still exist in the semiconductor layer grown from the buffer layer.

Therefore, it is desirable to provide a light emitting chip and a method for manufacturing the light emitting chip which can overcome the above-mentioned shortcomings.

BRIEF DESCRIPTION OF THE FIGURE

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
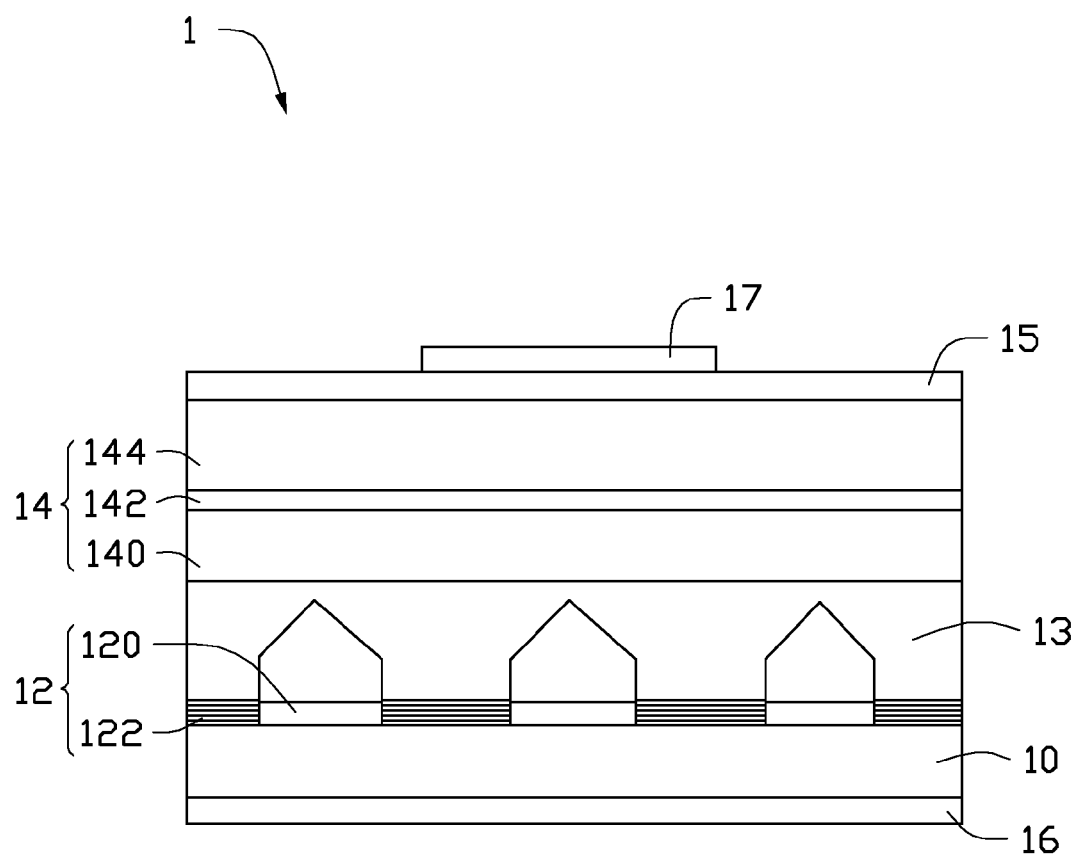
FIG. 1 is a schematic view of a light emitting chip in accordance with a first embodiment of the present disclosure.

Referring to FIG. 1, a light emitting chip 1 in accordance with a first embodiment of the present disclosure is disclosed. The light emitting chip 1 includes a substrate 10, a buffer layer 12 formed on the substrate 10, a cap layer 13 formed on the buffer layer 12, and a light emitting structure 14 formed on the cap layer 13.

The substrate 10 is made of a material with high thermal conductivity, such as sapphire, SiC, Si, GaN, or ZnO. The buffer layer 12 includes a catalyst layer 120 and a nitride nanostructure 122. The material of the catalyst layer 120 may be selected from Au, Ag, Fe, Co, Ni, Mo or other suitable transition metals. The catalyst layer 120 is used for providing growing medium for the nitride nanostructure 122. The catalyst layer 120 can be grown on a top surface of the substrate 10 via MOCVD (Metal-Organic Chemical Vapor Deposition) method or other suitable methods. The catalyst layer 120 is etched to form a number of patterns which are spaced from each other by multiple gaps, such as a number of elongated, protruded columns or an array of rectangular blocks (not shown). The nitride nanostructure 122 is horizontally grown from the catalyst layer 120 by reaction of a gas combination containing $N_2$, TMG (Trimethylgallium), and $NH_3$ on lateral sides of the patterns of the catalyst layer 120. In this embodiment, the nitride nanostructure 122 is formed as a number of islands received in the gaps between two adjacent patterns of the catalyst layer 120, respectively. The islands of the nitride nanostructure 122 are alternate with the patterns of the catalyst layer 120. Each island of the nitride nanostructure 122 is extended from a lateral side of a corresponding pattern to an opposite side of an adjacent pattern of the catalyst layer 120 so that the whole buffer layer 12 is continuously formed on the substrate 10 along a horizontal direction. In this embodiment, the nitride nanostructure 122 can be aluminum indium gallium nitride nanotube or aluminum indium gallium nitride nanowire ($Al_xGa_yIn_{(1-x-y)}N$, $0 \leq x \leq 1$, $0 \leq 1-x-y \leq 1$). The growth direction of the nitride nanostructure 122 can be controlled by selecting the growth condition, such as the chemical composition, proportion, partial pressure, and temperature of the gas combination, or by selecting the particular lattice direction of the substrate 10 as the growth surface of the nitride nanostructure 122, for example the (111) plane of Si, the α plane (11-20) and the γ plane (1-102) of sapphire.

The cap layer 13 is perpendicularly grown to a predetermined height from a top face of the nitride nanostructure 122, then is lateral epitaxial overgrown using the catalyst layer 120 as a mask so that the whole cap layer 13 is continuous along a horizontal direction. The material of the cap layer 13 is the same as the nitride nanostructure 122. In this embodiment, the material of the cap layer 120 is aluminum indium gallium nitride ($Al_xGa_yIn_{(1-x-y)}N$, $0 \leq x \leq 1$, $0 \leq y \leq 1$, $0 \leq 1-x-y \leq 1$).

The light emitting structure 14 includes a first semiconductor layer 140, a light emitting layer 142, and a second semiconductor layer 144. In this embodiment, the first semiconductor layer 140 is a P-type aluminum indium gallium nitride layer, the second semiconductor layer 144 is an N-type aluminum indium gallium nitride layer, and the light emitting layer 142 is a multi-quantum well aluminum indium gallium nitride layer. The light emitting structure 14 is grown on the cap layer 13 by sequentially forming the first semiconductor layer 140, the light emitting layer 142, and the second semiconductor layer 144.

A transparent conductive layer 15 is formed on a top face of the second semiconductor layer 144. The transparent conductive layer 15 may be made of ITO (Indium Tim Oxide) or an alloy of Ni/Au. The transparent conductive layer 15 can distribute current to uniformly flow through the first and second semiconductor layers 140, 144. A first electrode 16 is formed on a bottom face of the substrate 10. A second electrode 17 is formed on a top face of the transparent conductive layer 15. The first electrode 16 and the second electrode 17 of the light emitting chip 1 are electrically connected with the external circuit structures via metal wire such as golden wires (not shown) so that a driving power can be supplied to the light emitting structure 14.

Since the nitride nanostructure 122 is horizontal directional, the horizontal lattice mismatches are substantially eliminated by the nitride nanostructure 122. Therefore, the lattice defects in the cap layer 13 and the light emitting structure 14 grown from the nitride nanostructure 122 can be effectively decreased.

A method for manufacturing the light emitting chip 1 is also disclosed as follows.

Firstly, a substrate 10 is provided.

Secondly, a buffer layer 13 is formed on the substrate 10. The buffer layer 13 includes a number of catalyst layer patterns 120 which are spaced from each other by multiple gaps.

Thirdly, a number of nitride nanostructure islands 122 are horizontally grown in the gaps between two adjacent patterns of the catalyst layer 120, respectively.

Fourthly, a cap layer 13 is perpendicularly grown to a predetermined height from a top face of the corresponding nitride nanostructure island 122, then the cap layer 13 is lateral epitaxial overgrown using the catalyst layer patterns 120 as a mask to form a continuous cap layer 13 along a horizontal direction.

Fifthly, a light emitting structure 14 is grown on the cap layer 13. The light emitting structure 14 sequentially includes a first semiconductor layer 140 connected to a top surface of the cap layer 13, a light emitting layer 142, and a second semiconductor layer 144 with a transparent conductive layer 15 formed thereon.

Sixthly, a first electrode 16 and a second electrode 17 are formed on the substrate 10 and the transparent conductive layer 15, respectively.

In this embodiment, the substrate 10 of the light emitting chip 1 is electrically conductive, whereby the first electrode 16 can be made on the bottom face of the substrate 10 to form a vertical conductive type light emitting chip 1.

Figure 2:
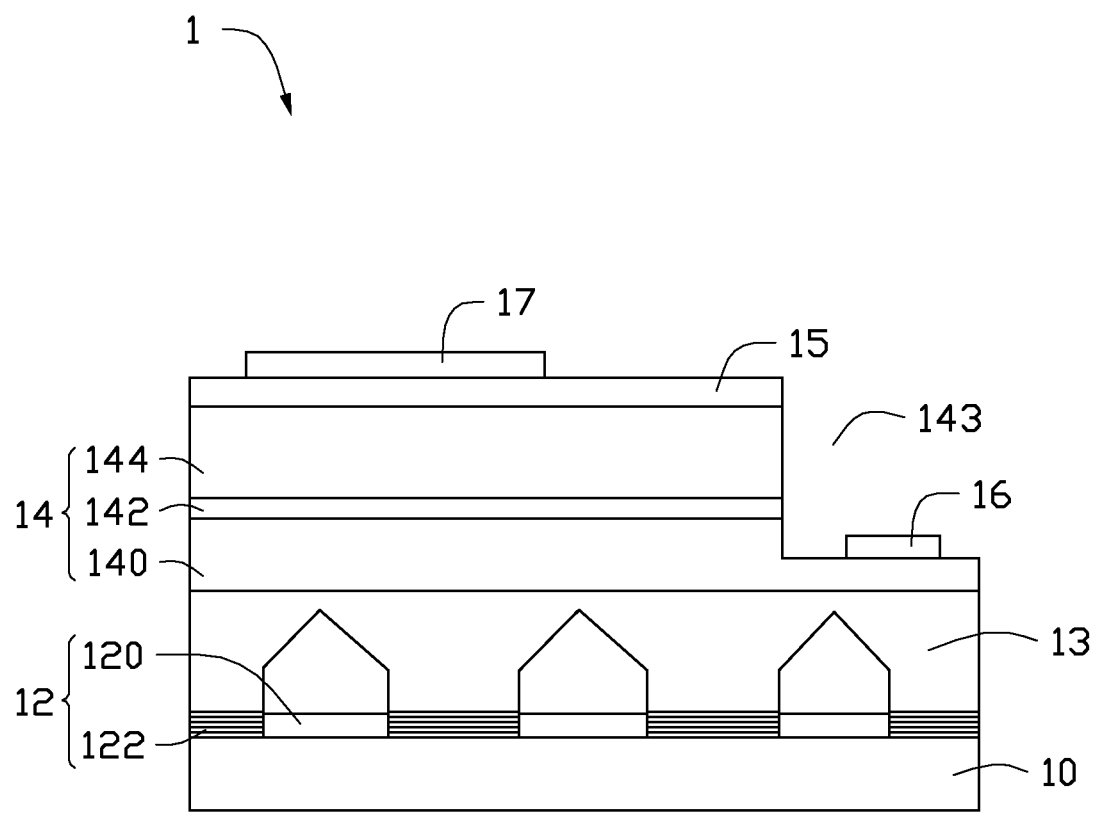
FIG. 2 is a schematic view of a light emitting chip in accordance with a second embodiment of the present disclosure.

Referring to FIG. 2, a light emitting chip 1 in accordance with a second embodiment of the present disclosure which has a non-conductive substrate 10 is shown. The light emitting chip 1 has a structure similar to that of the first embodiment except a location of the first electrode 16. The light emitting chip is etched to form a recess 143 in a lateral side thereof to expose a part of the first semiconductor layer 140. The first electrode 16 is directly formed on the exposed first semiconductor layer 140.

While various embodiments have been described, it is to be understood that the disclosure is not limited thereto. To the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A light emitting chip comprising:
   a substrate;
   a buffer layer formed on the substrate, the buffer layer comprising a nitride nanostructure;
   a cap layer formed on the nitride nanostructure; and
   a light emitting structure formed on the cap layer, the light emitting structure sequentially comprising a first semiconductor layer, a light emitting layer, and a second semiconductor layer;
   wherein the buffer layer further comprises a catalyst layer having a plurality of patterns spaced from each other; and
   wherein the nitride nanostructure comprises a plurality of discrete islands correspondingly between the patterns of the catalyst layer, the islands being grown from lateral sides of the pattern of the catalyst layer to form a horizontal directional nanostructure to minimize horizontal lattice mismatches between the substrate and the light emitting structure.

2. The light emitting chip as claimed in claim 1, wherein the nitride nanostructure is horizontally grown along a top surface of the substrate.

3. The light emitting chip as claimed in claim 1, wherein the nitride nanostructure is one of aluminum indium gallium nitride nanotube and aluminum indium gallium nitride nanowire.

4. The light emitting chip as claimed in claim 1, wherein the nitride nanostructure is $Al_xGa_yIn_{(1-x-y)}N$, in which $0 \leq x \leq 1$, $0 \leq y \leq 1$, $0 \leq 1-x-y \leq 1$.

5. The light emitting chip as claimed in claim 1, wherein the cap layer is $Al_xGa_yIn_{(1-x-y)}N$, in which $0 \leq x \leq 1$, $0 \leq y \leq 1$, $0 \leq 1-x-y \leq 1$.

6. The light emitting chip as claimed in claim 1, further comprising a transparent conductive layer formed on a top of the second semiconductor layer.

7. The light emitting chip as claimed in claim 6, further comprising a first electrode formed on a bottom of the substrate and a second electrode formed on a top of the transparent conductive layer, the substrate being electrically conductive.

8. The light emitting chip as claimed in claim 6, further comprising a first electrode and a second electrode, wherein the light emitting chip defines a recess to expose a part of the first semiconductor layer, the first electrode is directly formed on the exposed first semiconductor layer, and the second electrode is formed on a top of the transparent conductive layer.

9. The light emitting chip as claimed in claim 1, wherein each of the discrete islands of the nitride nanostructure directly connects two adjacent patterns of the catalyst layer.

10. A method for manufacturing a light emitting chip, comprising providing a substrate;
    forming a buffer layer on the substrate, the buffer layer comprising a nitride nanostructure and a catalyst layer, the catalyst layer comprising a plurality of patterns spaced from each other, the nitride nanostructure comprising a plurality of discrete islands corresponding between the patterns of the catalyst layer, the discrete islands being grown from lateral sides of patterns of the catalyst layer;
    growing a cap layer from a top of the nitride nanostructure; and
    growing a light emitting structure from a top of the cap layer, the light emitting structure sequentially comprising a first semiconductor layer, a light emitting layer, and a second semiconductor layer.

11. The method as claimed in claim 10, wherein the nitride nanostructure is grown horizontally on the substrate.

12. The method as claimed in claim 11, wherein the nitride nanostructure is made of material selected from group consisting of aluminum indium gallium nitride nanotube and aluminum indium gallium nitride nanowire.

13. The method as claimed in claim 10, wherein the nitride nanostructure is $Al_xGa_yIn_{(1-x-y)}N$, $0 \leq x \leq 1$, $0 \leq y \leq 1$, $0 \leq 1-x-y \leq 1$.

14. The method as claimed in claim 10, wherein the cap layer is $Al_xGa_yIn_{(1-x-y)}N$, $0 \leq x \leq 1$, $0 \leq y \leq 1$, $0 \leq 1-x-y \leq 1$.

15. The method as claimed in claim 10, wherein the light emitting chip comprises a transparent conductive layer formed on a top of the second semiconductor layer.

16. The method as claimed in claim 15, wherein the light emitting chip comprises a first electrode formed on a bottom of the substrate and a second electrode on a top of the transparent conductive layer.

17. The method as claimed in claim 15, wherein the light emitting chip comprises a first electrode and a second electrode, the light emitting chip defines a recess to expose a part of the first semiconductor, the first electrode is directly formed on the exposed first semiconductor layer, and the second electrode is formed on a top of the transparent conductive layer.

18. The method as claimed in claim 10, wherein each of the discrete islands of the nitride nanostructure directly connects two adjacent patterns of the catalyst layer.

* * * * *